(12) United States Patent
Liao et al.

(10) Patent No.: US 9,912,443 B2
(45) Date of Patent: Mar. 6, 2018

(54) DECODING APPARATUS AND DECODING METHOD INCLUDING ERROR CORRECTION PROCESS

(71) Applicant: MStar Semiconductor, Inc., Hsinchu Hsien (TW)

(72) Inventors: Yi-Ying Liao, Hsinchu Hsien (TW); Chen-Yi Liu, Hsinchu Hsien (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 0 days.

(21) Appl. No.: 15/285,639

(22) Filed: Oct. 5, 2016

(65) Prior Publication Data

US 2017/0346597 A1    Nov. 30, 2017

(30) Foreign Application Priority Data

May 27, 2016 (TW) .............................. 105116622 A

(51) Int. Cl.
*H03M 13/00* (2006.01)
*H04L 1/00* (2006.01)
*H03M 13/29* (2006.01)
*H03M 13/27* (2006.01)

(52) U.S. Cl.
CPC .......... *H04L 1/0047* (2013.01); *H03M 13/27* (2013.01); *H03M 13/2927* (2013.01); *H03M 13/6555* (2013.01); *H04L 1/0071* (2013.01)

(58) Field of Classification Search
CPC ................. H04L 1/0047; H04L 1/0071; H04L 13/65555; H03M 13/27; H03M 13/2927
See application file for complete search history.

(56) References Cited

U.S. PATENT DOCUMENTS

| 5,438,635 A | * | 8/1995 | Richards | ................ | H04N 9/804 |
| | | | | | 341/76 |
| 6,687,315 B2 | * | 2/2004 | Keevill | ................ | H04L 27/265 |
| | | | | | 375/326 |
| 7,426,240 B2 | * | 9/2008 | Peron | ................ | H03M 13/2757 |
| | | | | | 375/260 |

(Continued)

FOREIGN PATENT DOCUMENTS

CN           103441804 A      12/2013

*Primary Examiner* — Esaw Abraham
(74) *Attorney, Agent, or Firm* — Edell, Shapiro & Finnan, LLC

(57) ABSTRACT

A decoding apparatus includes a differential decoder, an error correction decoder and a controller. The differential decoder performs differential decoding according to a differential encoding dependency to generate a differential decoding result. The error correction decoder performs a decoding process on multiple packets that need to be corrected according to the differential decoding result to accordingly generate respective error correction records, wherein the packets are generated according to the differential decoding results, and the packets include a first packet and a second packet. When the error correction record of the first packet indicates that the decoding process of the first packet is unsuccessful, the controller generates a set of error position information according to the error correction record of the second packet, and requests the error correction decoder to perform another decoding process on the first packet according to the error position information.

10 Claims, 5 Drawing Sheets

(56) References Cited

U.S. PATENT DOCUMENTS

| | | | | |
|---|---|---|---|---|
| 7,826,712 B2* | 11/2010 | Minnick | ............. | G11B 27/005 386/247 |
| 8,027,294 B2* | 9/2011 | Kim | ................ | H04L 25/03012 370/329 |
| 8,199,615 B2* | 6/2012 | Tamaki | .............. | G11B 7/08511 369/44.32 |
| 8,644,406 B2* | 2/2014 | Ko | .................... | H03M 13/1165 375/260 |
| 8,804,866 B2* | 8/2014 | Yamamoto | ............ | H04H 20/22 375/267 |
| 9,203,558 B1* | 12/2015 | Dave | ................... | H04L 1/0054 |
| 2002/0138793 A1 | 9/2002 | Wilhelmsson | | |

* cited by examiner

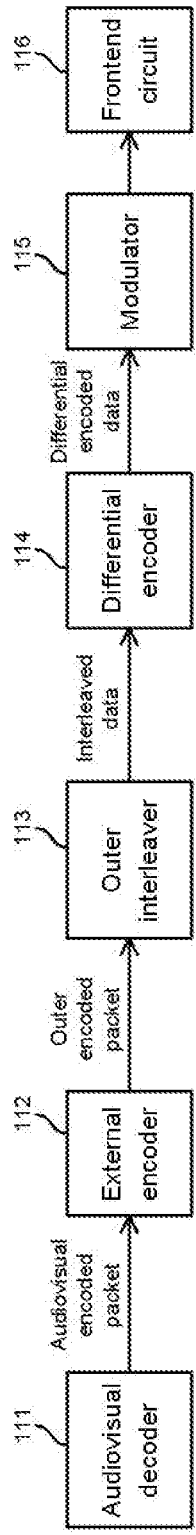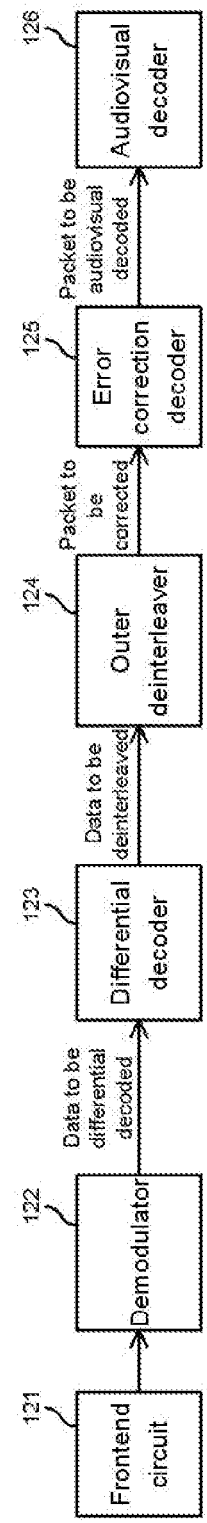
FIG. 1(A) (prior art)
FIG. 1(B) (prior art)

US 9,912,443 B2

DECODING APPARATUS AND DECODING METHOD INCLUDING ERROR CORRECTION PROCESS

This application claims the benefit of Taiwan application Serial No. 105116622, filed May 27, 2016, the subject matter of which is incorporated herein by reference.

BACKGROUND OF THE INVENTION

Field of the Invention

The invention relates in general to an error correction decoder, and more particularly to a technology capable of increasing the probability of successful error correction.

Description of the Related Art

A signals may be distorted as channels for transmitting signals are often interfered by various types of noises in real environments. Having arrived at a receiver, the distorted signal is down-converted to a baseband digital signal, demodulated by a demodulator, and decoded by a decoder. Further, an error bit in the signal is corrected. One most important task of an error correction code is correcting errors generated during the signal transmission channel to achieve highly reliable signal transmission. A Reed-Solomon code is a type of error correction code commonly applied in high-speed digital communication transmission systems. The Reed-Solomon code provides outstanding error correction capability on burst errors or random errors generated during the transmission process, and is thus a popular means for channel error correction encoding/decoding.

FIG. 1(A) shows an example of a function block diagram of a Digital Video Broadcasting-Cable (DVB-C) transmitter. An audiovisual decoder 111 encodes video data, audio data and other auxiliary data to a series of audiovisual encoded packets, each of which having a length of 188 bytes. An outer encoder 112 performs Reed-Solomon encoding on the audiovisual encoded packets. With a 16-byte check code added, the length of each outer encoded packet outputted by the outer encoder 11 is increased to 204 bytes. Alternatively, it is commonly regarded that each of the outer encoded packets includes 204 symbols. Next, an outer interleaver 113 performs a convolutional interleaving process on the outer encoded packets so that the order of the data is rearranged to reinforce an error tolerance of the data. A differential encoder 114 performs a differential encoding process on two most significant bits (MSB) of each of the symbols. A modulator 115 then performs quadrature amplitude modulation (QAM) on the differential encoded data, and forwards the modulated data to a frontend circuit 116 that performs up-conversion and digital-to-analog conversion processes.

FIG. 1(B) shows a function block diagram of a DVB-C receiver. By comparing FIG. 1(A) and FIG. 1(B), it is observed that, after entering the receiver, the signal sequentially passes a frontend circuit 121, a demodulator 122, a differential decoder 123, an outer deinterleaver 124, an error correction decoder 125 and an audiovisual decoder 126, which respectively correspond to the function blocks in the transmitter shown in FIG. 1(A). Each of the packets to be corrected received by the error correction decoder 125 includes 204 symbols, which include one or multiple symbols containing errors caused by noise interference during the transmission process. The error correction decoder 125 performs decoding according to characteristics of the Solomon-Reed coding, and at the same time identifies and corrects the errors.

The error correction capability of a Reed-Solomon decoder is associated with the number of check codes—the larger the amount of check codes is, the higher the error correction capability the decoder has. Assuming that in a packet, among n symbols, k symbols are actual data and (n−k) symbols are check codes, an upper limit of the error correction capability of the Reed-Solomon decoder is (n−k) symbols. More specifically, given knowing positions of all erroneous symbols in the packet in advance (without knowing actual contents of the errors), the Reed-Solomon decoder is capable of correcting at most (n−k) number of erroneous symbol contents. However, without knowing positions and contents of any of the erroneous symbols, the Reed-Solomon decoder can only correct at most (n−k)/2 number of erroneous symbol contents. Combining the two situations above, assuming that the positions of F number of erroneous symbols in one packet are learned in advance and F is smaller than (n−k), in addition to correcting the F erroneous symbols, the Reed-Solomon is capable of further correcting at most E number of erroneous symbols (without knowing the positions of these erroneous symbols), where an upper limit of the amount E is $[(n-k)-F]/2$. Thus, the error correction capability of a Reed-Solomon decoder is often represented as $2E+F \leq (n-k)$.

Taking the DVB-C receiver shown in FIG. 1(B) for example, in each packet to be corrected received by the error correction decoder 125, 188 symbols are actual data, and 16 symbols are check codes. It is then known that, the upper limit of the error correction capability of the Reed-Solomon decoder 125 is $2E+F \leq (204-188)=16$. That is, without knowing the position of any of the erroneous symbols (F=0), given that the number of erroneous symbols in one packet to be correct does not exceed 8 (E≤8), the error correction decoder 125 is capable of correcting all erroneous symbols in this packet to be corrected in the decoding process. In contrast, without knowing the position of any of the erroneous symbols of this packet to be corrected, if the number of erroneous symbols exceeds 8, the error correction decoder 125 can only consider this packet to be decoded non-decodable, i.e., the decoding process of this packet to be decoded is unsuccessful. In another example, assuming that the positions of 5 erroneous symbols of a packet to be decoded are learned in advance (F=5), in addition to these 5 erroneous symbols with known positions, the error correction decoder 125 is further capable of correcting 5 erroneous symbols with unknown positions in this packet to be corrected (F E≤5.5), meaning that the total number of correctable erroneous symbols in this packet has increased to 10 symbols (with 5 known positions and 5 unknown positions).

The above examples point out one characteristic of the Reed-Solomon coding—if the position information of a part or all of the errors is learned in advance before decoding, the total number of errors that can be corrected by a Reed-Solomon decoder is increased. Therefore, concerning the Reed-Solomon code or an error correction code with the same characteristic above, there is a need for a solution that identifies reliable position information of errors for the use of an error correction decoder.

SUMMARY OF THE INVENTION

The invention is directed to a decoding apparatus and a decoding method suitable for differential encoded and error correction encoded signals. In the decoding apparatus and the decoding method of the present invention, when a signal has been differential decoded and needs to be further error correction decoded, a position of an error in a packet can be reasonably estimated by using a known differential encoding dependency, hence increasing the number of errors that can be corrected by the decoding process.

According to an embodiment of the present invention, a decoding apparatus including a differential decoder, an error correction decoder and a controller is provided. The differential decoder performs a differential decoding process on multiple sets of data to be differential decoded according to a differential encoding dependency to generate a differential decoding result. The error correction decoder performs a decoding process on multiple packets that need to be corrected to accordingly generate respective error correction records, wherein the packets are generated according to the differential result, and the packets include a first packet and a second packet. The controller receives the error correction records. When the error correction record of the first packet indicates that the decoding process that the error correction decoder performs on the first packet is unsuccessful, the controller generates a set of error position information of the first packet according to the error correction record of the second packet, and requests the error correction decoder to perform another decoding process on the first packet according to the set of error position information. The second packet is a differential encoding reference packet of the first packet according to the differential encoding dependency.

According to another embodiment of the present invention, a decoding method includes: performing a differential decoding process on multiple sets of data to be differential decoded according to a differential encoding dependency to generate a differential decoding result; performing a decoding process on multiple packets that need to be corrected to accordingly generate respective error correction records, wherein the packets are generated according to the differential result, and the packets include a first packet and a second packet; when the error correction record of the first packet indicates that the decoding process performed on the first packet is unsuccessful, generating a set of error position information according to the error correction record of the second packet, wherein the second packet is a differential encoding reference packet of the first packet according to the differential encoding dependency; and performing another decoding process on the first packet according to the set of error position information.

The above and other aspects of the invention will become better understood with regard to the following detailed description of the preferred but non-limiting embodiments. The following description is made with reference to the accompanying drawings.

BRIEF DESCRIPTION OF THE DRAWINGS

FIG. 1(A) and FIG. 1(B) are function block diagrams of a DVB-C transmitter and a DVB-C receiver, respectively;

Figure 2:
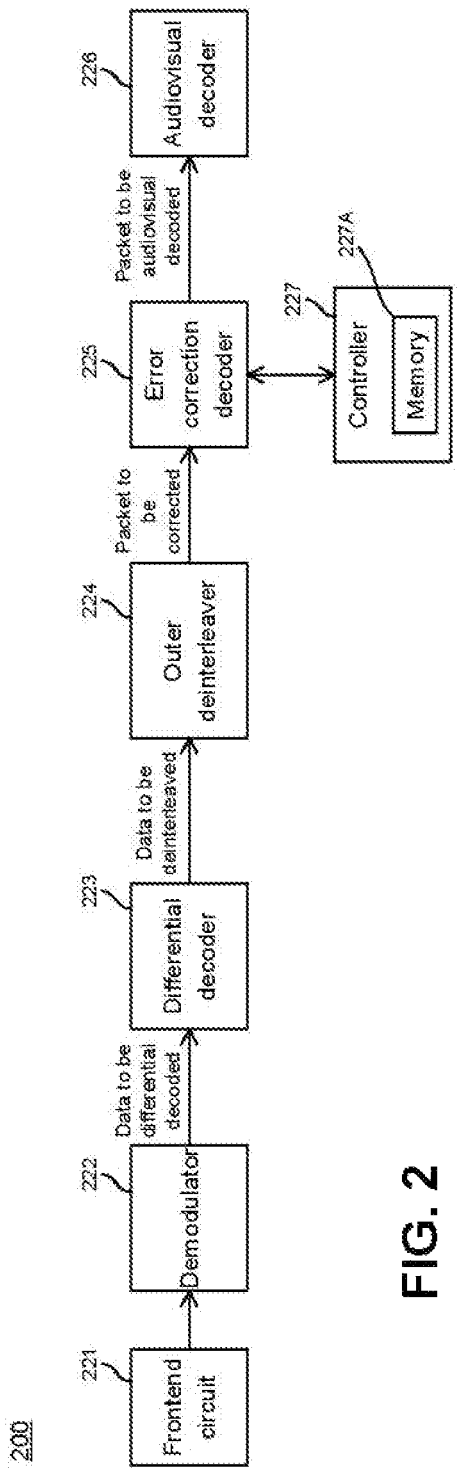
FIG. 2 is a function block diagram of a DVB-C receiver according to an embodiment of the present invention.

It should be noted that, the drawings of the present invention include functional block diagrams of multiple functional modules related to one another. These drawings are not detailed circuit diagrams, and connection lines therein are for indicating signal flows only. The interactions between the functional elements/or processes are not necessarily achieved through direct electrical connections. Further, functions of the individual elements are not necessarily distributed as depicted in the drawings, and separate blocks are not necessarily implemented by separate electronic elements.

DETAILED DESCRIPTION OF THE INVENTION

A decoding apparatus is provided according to an embodiment of the present invention. The decoding apparatus includes a differential decoder, an error correction decoder and a controller. In practice, the decoding apparatus may be an independent unit, or may be integrated in various types of decoding systems supporting both a decoding function and an error correction function. FIG. 2 shows a function block diagram of the decoding apparatus applied to a Digital Video Broadcasting-Cable (DVB-C) receiver. With the following description, one person skilled in the art can understand that, the spirit of the present invention may be realized by receivers of other specifications, and is not limited to such DVB-C receiver.

As shown in FIG. 2, the DVB-C receiver 200 includes a frontend circuit 221, a demodulator 222, a differential decoder 223, an outer deinterleaver 224, an error correction decoder 225, an audiovisual decoder 226 and a controller 227. Operations details of the frontend circuit 221, the demodulator 222, the outer deinterleaver 224 and the audiovisual decoder 226 are generally known to one person skilled in the art, and shall be omitted herein. Instead, details of the differential decoder 223, the error correction decoder 225 and the controller 227 are given below.

According to differential decoding in the DVB-C specification, when the differential encoder 114 in FIG. 1(A) generates the differential encoded data corresponding to two most significant bits (MSB) of the $i^{th}$ symbol in the $N^{th}$ outer encoded packet (where N is a positive integer and i is an integral index), in addition to the interleaved data corresponding to the two MSBs of the $i^{th}$ symbol in the $N^{th}$ outer encoded packet, the differential encoded data corresponding to two MSBs of the $(i+1)^{th}$ symbol in the $(N-1)^{th}$ outer encoded packet is also used. In the description below, it is referred that the $N^{th}$ outer encoded packet and the $(N-1)^{th}$ outer encoded packet are correlated by a differential encoded dependency, and the $(N-1)^{th}$ outer encoded packet is a differential encoded reference packet of the $N^{th}$ outer encoded packet.

Figure 3:
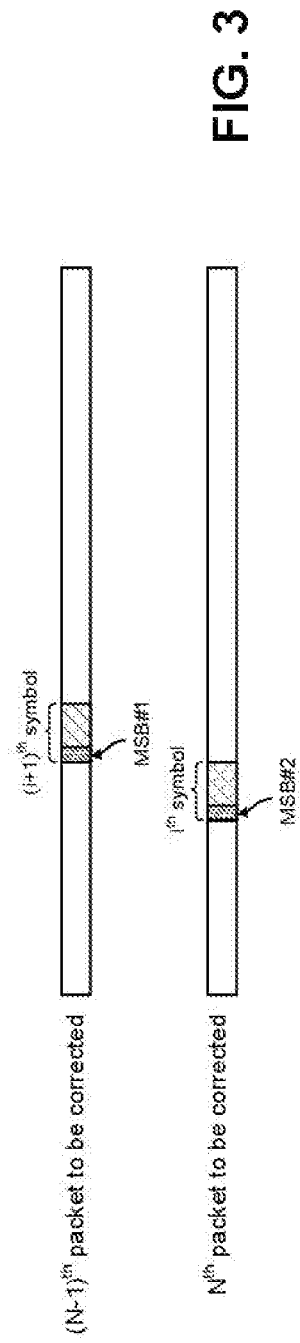
FIG. 3 is a schematic diagram of a differential encoding dependency between two packets to be corrected.

Corresponding to the DVB-C transmitter, at the DVB-C receiver, among a series of packets to be corrected, the $N^{th}$ packet and the $(N-1)^{th}$ packet are also correlated by the differential encoding dependency mentioned above, and the $(N-1)^{th}$ packet is the differential encoding reference packet of the $N^{th}$ packet. Based on such differential encoding dependency, when the differential decoder 223 tries to generate a differential decoding result (denoted as data to be deinterleaved in the drawing) corresponding to the two MSBs of the $i^{th}$ symbol in the $N^{th}$ packet, the data to be differential decoded corresponding to the two MSBs of the $i^{th}$ symbol in the $N^{th}$ packet as well as the data to be differential decoded corresponding to the two MSBs of the $(i+1)^{th}$ symbol in the $(N-1)^{th}$ packet are required. Accordingly, it may be deduced that, in the event of an error occurring in the two MSBs of the $(i+1)^{th}$ symbol in the $(N-1)^{th}$ packet during the transmission process, the corresponding data to be differential decoded inevitably becomes erroneous, which is likely to cause an error in the differential decoding result (denoted as data to be deinterleaved in the drawing) corresponding to the two MSBs of the $i^{th}$ symbol in the $N^{th}$ packet to be corrected. Referring to FIG. 3 showing a schematic diagram, the two MSBs of the $(i+1)^{th}$ symbol in the $(N-1)^{th}$ packet are denoted as MSB#1, and the two MSBs of the $i^{th}$ symbol in the $N^{th}$ packet to be corrected are denoted as MSB#2. When an error occurs in the MSB#1 during the transmission process, it is possible that the MSB#2 that the error correction decoder 225 receives also becomes erroneous.

The error correction decoder 225 performs a Reed-Solomon decoding process on a packet to be corrected outputted from the outer deinterleaver 224, and performs error correction while the decoding process is performed. Corresponding to the outer encoded packets that the outer encoder 112 provides to the outer interleaver 113 in FIG. 1(A), the error correction decoder 225 receives multiple packets to be corrected, each of which including 204 symbols. When the decoding process is initially performed on one of the packets to be corrected, the error correction decoder 225 is usually yet unaware of positions of erroneous symbols. As previously stated, given that the number of erroneous symbols in one packet to be corrected does not exceed 8, the error correction decoder 225 is nonetheless capable of successfully decoding the packet even if no position information of any error is learned; that is, the error correction decoder 225 is capable of identifying the positions of all erroneous symbols in the packet to be corrected and correcting all of these erroneous symbols. Conversely, without knowing the position information of any error, if the number of erroneous symbols in one packet (among the packets to be corrected) exceeds 8, the error correction decoder 225 is then incapable of correcting any of the erroneous symbols, nor is it capable of learning the position information of any error—such situation is considered unsuccessful decoding.

In this embodiment, when decoding is successful, the error correction decoder 225 generates and sends an error correction record to the controller 227, to inform the controller 227 that the packet to be corrected contained error(s) and the error correction decoder 225 has corrected position(s) of the erroneous symbol(s) (from a minimum of 0 to a maximum of 8). For a packet that needs to be corrected but is unsuccessfully decoded, the error correction decoder 225 also generates an error correction record to the controller 227, to inform the controller 227 of the unsuccessful decoding process. In practice, as shown in FIG. 2, the controller 227 may include a memory 227A that stores the error correction records.

In this embodiment, for a packet to be corrected that is successfully decoded by the error correction decoder 225, in addition to storing the corresponding error correction record, the controller 227 does not perform other operations. In contrast, in the event of unsuccessful decoding performed by the error correction decoder 225, the controller 227 intervenes; that is, according to the differential encoding dependency between two packets to be corrected, the controller 227 attempts to identify error position information that the error correction decoder 225 can refer to. Associated details are as given below.

As previously stated, between the $N^{th}$ packet and the $(N-1)^{th}$ packet in the packets to be corrected a differential encoding dependency exists. The differential encoding dependency is defined according to the DVB-C specification, and is a priori information to the controller 227. When the error correction record that the controller 227 receives indicates decoding of the $N^{th}$ packet is unsuccessful, the controller 227 finds the error correction record of the $(N-1)^{th}$ packet from the memory 227A, and looks up the two MSBs of which of the symbols of the $(N-1)^{th}$ packet were erroneous at the input of the error correction decoder 225 but have been corrected by the error correction decoder 225.

For example, assuming that the error correction record of the $3^{rd}$ packet that is to be corrected (N=3) indicates that the error correction decoder 225 unsuccessfully decoded the $3^{rd}$ packet, the controller 227 searches the error correction record of the $2^{nd}$ packet (N=3) from the memory 227A. Assume that the error correction record of the $2^{nd}$ packet indicates that the error correction decoder 225 has previously corrected three errors of the $2^{nd}$ packet, namely, two MSBs of the $8^{th}$ symbol, two least significant bits (LSBs) of the $53^{rd}$ symbol, and four MSBs of the $136^{th}$ symbol. In this example, the $8^{th}$ symbol and the $136^{th}$ symbol of the $2^{nd}$ packet respectively satisfy the condition of "two MSBs were erroneous at the input of the error correction decoder 225 but have been corrected by the error correction decoder 225". As previously stated, in the event of an error occurring in the two MSBs of the $(i+1)^{th}$ symbol in the $(N-1)^{th}$ packet that is to be corrected during the transmission process, an error is much likely to occur in the two MSBs of the $i^{th}$ symbol of the $N^{th}$ packet to be corrected. Thus, it can be deduced that, two MSBs in each of the $7^{th}$ symbol and the $135^{th}$ symbol of the $3^{rd}$ packet are likely erroneous. In the above situation, the controller 227 may regard the $7^{th}$ symbol and the $135^{th}$ symbol of the $3^{rd}$ packet to be corrected as erroneous symbols and accordingly generate two corresponding sets of error position information. The controller 227 then requests the error correction decoder 225 to perform another decoding process on the $3^{rd}$ packet according to these two sets of error position information.

As previously stated, the error correction capability of the error correction decoder 225 is 2E×F≤16. When the error correction decoder 225 initially performs the decoding process on the $3^{rd}$ packet, it is not yet informed of any error position information, and so the value F is equal to 0 and an upper limit of the value E is equal to 8. According to the differential encoding dependency, the controller 227 finds two sets of error position information for the $3^{rd}$ packet, so the value F is changed to 2 and the upper limit of the value E is changed to 7, such that the capability to correct erroneous symbols (i.e., the sum of the value E and the upper limit of the value F) of the error correction decoder 225 for the $3^{rd}$ packet is increased from 8 to 9. Thus, it is seen that, by figuring out the error position information using the controller 227 according to the differential encoding dependency, it is more likely the error correction decoder 225 can successfully correct the $3^{rd}$ packet when decoding process is again performed on the $3^{rd}$ packet.

In the above example, in the $53^{rd}$ symbol of the $2^{nd}$ packet that is to be corrected, it is the two LSBs that are previously corrected by the error correction decoder 225, and thus do not satisfy the condition of "two MSBs with errors at the input of the error correction decoder 225 but have been corrected by the error correction decoder 225". Thus, the controller 227 does not accordingly generate a set of error position information. It is seen that, the error correction record of the (N−1)$^{th}$ packet may not be entirely useful for the controller 226 to accordingly generate valid error position information. However, given that the error correction decoder 225 previously successfully decodes at least one erroneous symbol of the (N−1)$^{th}$ packet among the packets to be corrected, the controller 227 stands a chance of generating the error position information of the Nth packet according to the differential encoding dependency and the error correction record of the (N−1)$^{th}$ packet.

It should be noted that, implementation details of differential decoding and Reed-Solomon decoding are generally known to one person skilled in the art, and shall be omitted herein.

In practice, the controller 227 may be implemented as a fixed and/or programmable logic circuit, e.g., a programmable logic gate array, an application-specific integrated circuit, a microcontroller, a microprocessor or a digital signal processor. Alternatively, the controller 27 may be designed to complete a designated task through executing a processor command stored in the memory 227A. Further, the scope of the present invention is not limited to a predetermined storage mechanism. The memory 227A may include one or multiple volatile or non-volatile memory devices, e.g., DRAM, ROM, magnetic and/or optical memories, and flash memories.

Figure 4:
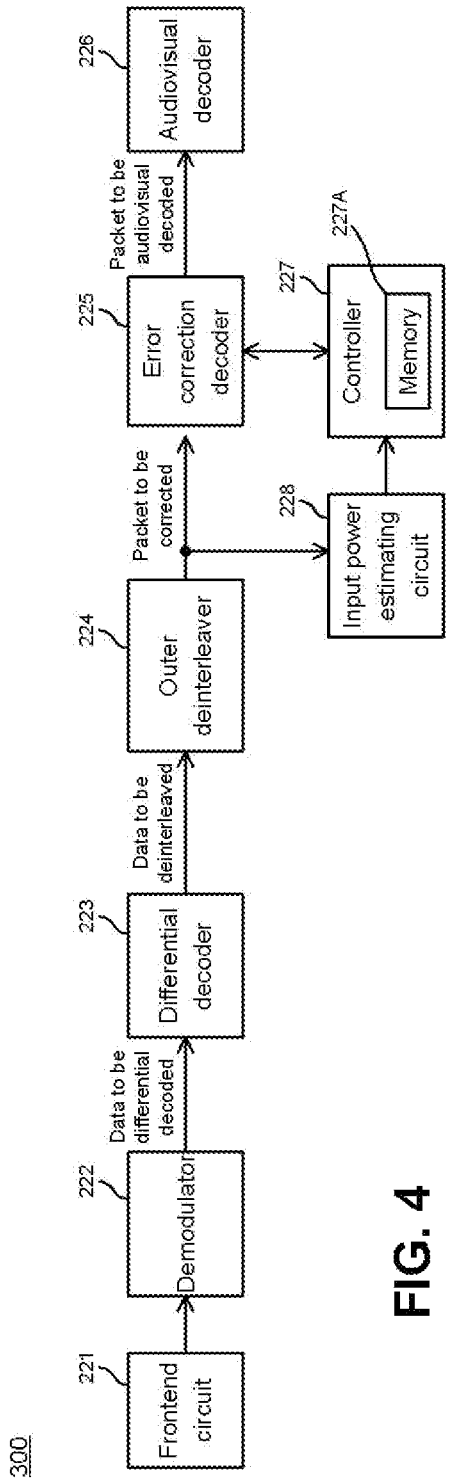
FIG. 4 is a function block diagram of a DVB-C receiver further including an input power estimating circuit according an embodiment of the present invention.

In another embodiment, the decoding apparatus of the present invention further includes an input power estimating circuit. As shown in FIG. 4, compared to the DVB-C receiver 200, a DVB-C receiver 300 further includes an input power estimating circuit 228. The input power estimating circuit 228 generates respective estimated input power values of a plurality of sets of data (e.g., symbols) included in a packet, and calculates respective differences between the estimated input power values and a reference power for the controller 227. In general, the power without any erroneous symbol falls within a known approximate range (e.g., generated through experiments or statistics), whose median value may serve as the above reference power. In contrast, the power of a symbol with errors frequently differs greatly from this reference power. It may then be deduced that, a symbol having a power that differs greatly from the reference power is likely an erroneous symbol.

In the DVB-C receiver 300, the error correction decoder 225 may first attempt to decode a packet among the packets to be corrected without knowing any error position information. If the initial decoding process is unsuccessful, the error correction decoder 225 may again decode this packet according to the error position information identified according to the differential encoding dependency. If the decoding process is again unsuccessful, power differences higher than a predetermined threshold are identified from the power differences that the input power estimating circuit 228 generates, and the controller 227 selects one or multiple sets of candidate error position information according to the power differences higher than the predetermined threshold. The controller 227 then again requests the error correction decoder 225 to further perform another decoding process on this packet according to the one or multiple sets of candidate error position information. More specifically, in addition to the error position information generated according to the differential encoding dependency, the controller 227 may further provide other candidate error position information according to the input powers of the symbols, so as to assist the error correction decoder 225 to more likely successfully decode the packet.

In one embodiment, an upper number limit is set in advance for the error position information that the controller 227 provides to the error correction decoder 225. For example, assuming that the upper number limit is 10, if the error position information generated according to the differential encoding dependency already indicates that there are six erroneous symbols in one packet, the controller 227 selects four sets of candidate error position information (e.g., four symbols corresponding to largest differences between the input powers and the reference power) at most according to the input powers.

It is proven through simulations that, the candidate error position information that the controller 227 selects according to the input powers do not necessarily correspond to existing erroneous data. Further, selecting candidate error position information that is in fact not erroneous for the error correction decoder 225 to perform the decoding process, may cause the error correction decoder 225 to misjudge that a certain packet having been corrected while in fact that certain packet has not been corrected; that is, the error correction decoder 225 has mistaken the certain packet as another packet. Thus, in another embodiment, the decoding apparatus of the present invention further includes a checking circuit. The checking circuit checks the candidate error position information selected according to the input powers to prevent the above misjudgment, with associated details given below.

Figure 5:
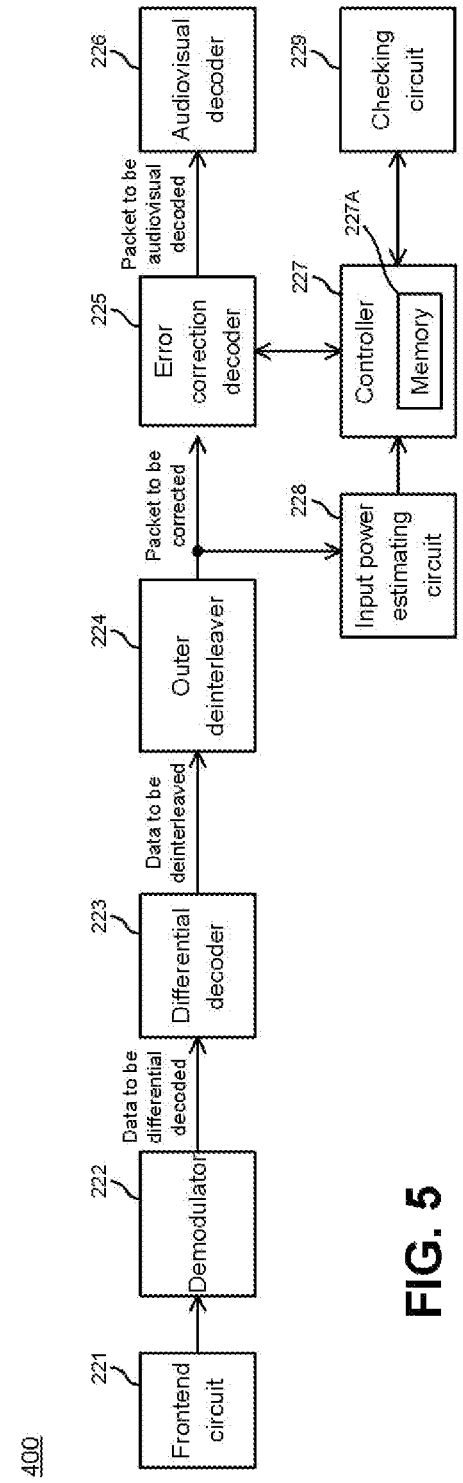
FIG. 5 is a function block diagram of a DVB-C receiver further including a review circuit according an embodiment of the present invention.

As shown in FIG. 5, compared to the DVB-C receiver 300, a DVB-C receiver 400 further includes a review circuit 229. For example, assume that the controller 227 selects six sets of candidate error position information for a packet to be corrected according to input powers. Thus, the controller 227 first selects less than six sets (e.g., five sets) of candidate error position information from the six sets of candidate error position information as a first candidate combination, and requests the error correction decoder 225 to perform a decoding process on the packet according to the error position information generated according to the differential encoding dependency and the first candidate combination. If the decoding process, which the error correction decoder 225 performs on the packet according to the error position information generated according to the differential encoding dependency and the first candidate combination, is determined successful, the checking circuit 229 determines whether the corrected erroneous symbols of the packet satisfy an error distribution condition according to the error correction record that the error correction decoder 225 provides to the controller 227. For example, the error distribution condition may be "three consecutive adjacent symbols in the same packet are corrected by the error correction decoder 225". In practice, it is a rare occasion where multiple adjacent symbols are erroneous. That is to say, if the first candidate combination renders the packet having been corrected to satisfy the above error distribution condition, it means that the candidate error positions included in the first candidate combination has poor reliability. Thus, in this embodiment, the controller 227 discards the first candidate combination, selects another five sets of candidate error positions from the six sets of candidate error position information as a second candidate combination, and requests the error correction decoder 225 to again perform decoding process on the packet according to the error position information generated according to the differential encoding dependency and the second candidate combination, and so forth.

Figure 6:
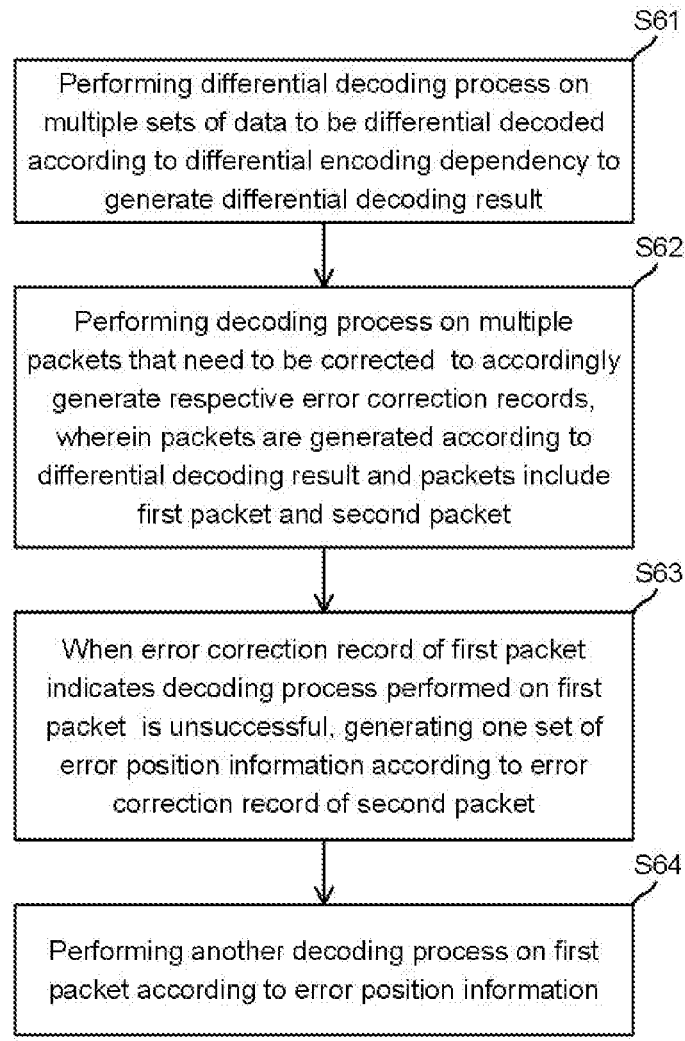
FIG. 6 is a flowchart of a decoding method according to an embodiment of the present invention.

A decoding method is provided according to another embodiment of the present invention. FIG. 6 shows a flowchart of the decoding method. In step S61, a differential decoding process is performed on multiple sets of data to be differential decoded according to a differential encoding dependency to generate a differential decoding result. In step S62, a decoding process is performed on multiple packets that need to be corrected to accordingly generate respective error correction records, wherein the packets are generated according to the differential decoding result, and the packets include a first packet and a second packet. In step S63, when the error correction record of the first packet to be corrected indicates that the decoding process performed on the first packet is unsuccessful, a set of error position information is generated according to the error correction record of the second packet, wherein the second packet is a differential encoding reference packet of the first packet according to the differential encoding dependency. In step S64, another decoding process is performed on the first packet according to the error position information.

Figure 7:
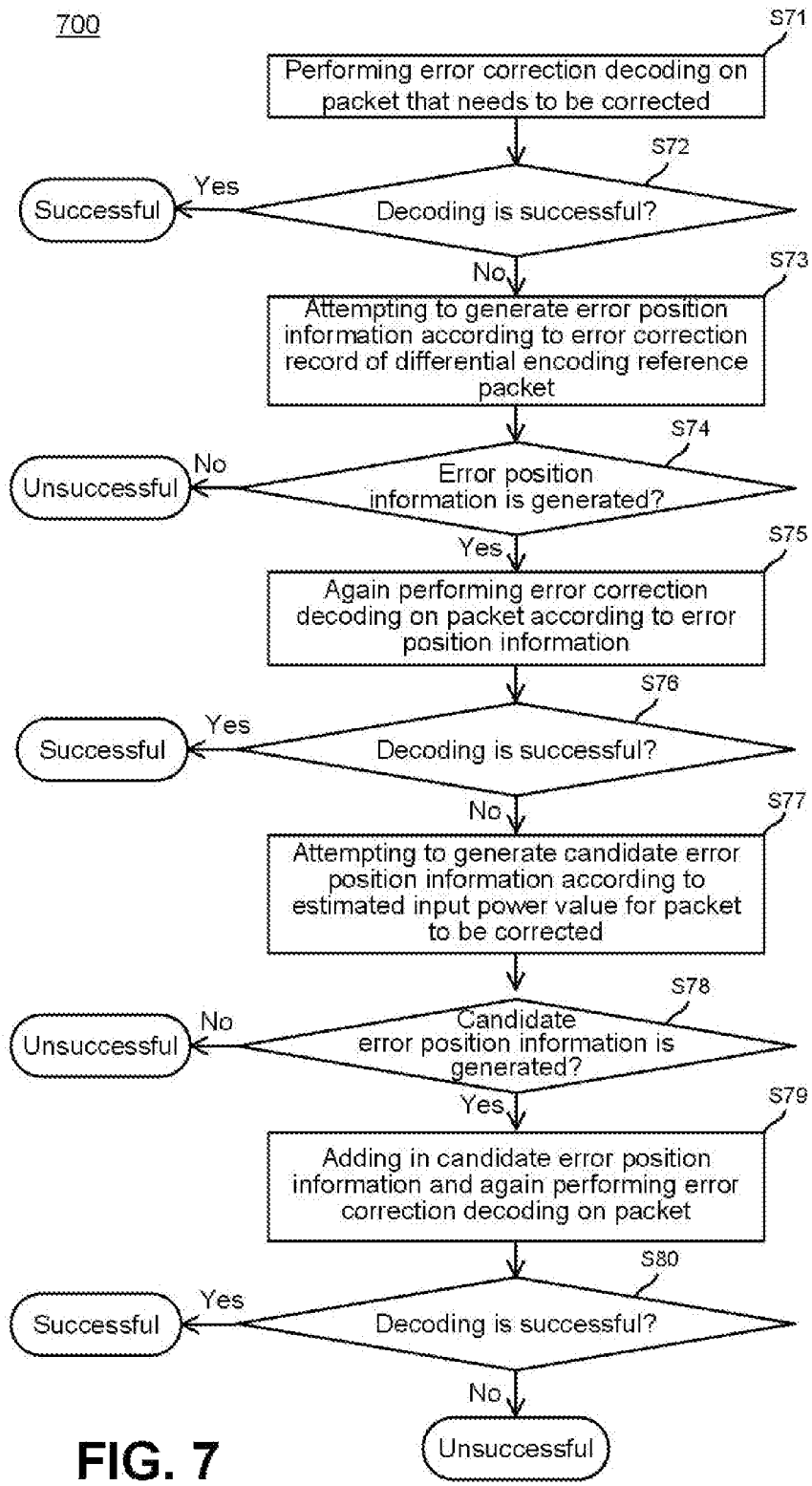
FIG. 7 is a flowchart of a decoding method according to another embodiment of the present invention.

FIG. 7 shows a flowchart of a process 700 of a decoding method for correcting one single packet to be corrected and further including the abovementioned input power estimating process according to another embodiment of the present invention. In step S71, an error correction decoding process is performed on a packet that needs to be corrected. In step S72, it is determined whether the error correction decoding process in step S71 is successful. When a determination result of step S72 is affirmative, the decoding process 700 ends and has a successful status. When the determination result of step S72 is negative, step S73 is performed to attempt to generate error position information according to the error correction record of a differential encoding reference packet. As previously stated, if none of the symbols in the differential encoding reference packet satisfies the condition of "two MSBs with errors at the input of the error correction decoder but have been corrected by the error correction decoder", no useful error position information can be generated. In step S74, it is determined whether any error position information is generated in step S73. When a result of step S73 is negative, the decoding process ends 700 and has an unsuccessful status. When the determination result of step S73 is affirmative, step S75 is performed to perform another error correction decoding process on the packet to be corrected according to the error position information.

In step S76, it is determined whether the error correction decoding process is successful. When a determination result of step S76 is affirmative, the decoding process 700 ends and has a successful status. When the determination result of step S76 is affirmative, step S77 is performed to attempt to generate candidate error position information according to multiple estimated input power values of the packet to be corrected. As previously stated, the candidate error position information is selected according to a power difference higher than a predetermined threshold. Thus, no candidate error position information is generated if the packet to be corrected does not contain any power difference higher than the predetermined threshold. In step S78, it is determined whether any candidate error position information is generated in step S77. When a determination result of step S78 is negative, the decoding process 700 ends and has an unsuccessful status. When the determination result of step S78 is affirmative, step S79 is performed to further consider, in addition to the error position information generated in step S73, the candidate error position information generated in step S77 to accordingly perform another decoding process on the packet to be corrected. In step S80, it is determined whether the error correction decoding process in step S79 is successful. When a determination result of step S80 is affirmative, the decoding process 700 ends and has a successful status. When the determination result of step S80 is negative, the decoding process 800 ends and has an unsuccessful status. With this unsuccessful status, the DVB-C receiver may ask the DVB-C transmitter to again transmit the signal corresponding to the packet to be corrected.

One person skilled in the art can apply variations and operations in the description associated with the DVB-C receivers 200, 300 and 400 to the decoding methods in FIG. 6 and FIG. 7. Such repeated details are omitted herein.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A decoding apparatus, comprising:
   a differential decoder, performing a differential decoding process on a plurality of sets of data to be differential decoded according to a differential encoding dependency to generate a differential decoding result;
   an error correction decoder, performing a decoding process on a plurality of packets that need to be corrected to accordingly generate respective error correction records, wherein the packets are generated according to the differential decoding result, and the packets comprises a first packet and a second packet; and
   a controller, generating a set of error position information according to the error correction record of the second packet when the error correction record of the first packet indicates that the decoding process performed on the first packet is unsuccessful, and sending a request to have the error correction decoder perform another decoding process on the first packet according to the set of error position information, wherein the second packet and the first packet are correlated by the differential encoding dependency.

2. The decoding apparatus according to claim 1, further comprising:
   an input power estimating circuit, generating a plurality of estimated input power values for the first packet, and calculating respective power differences between the estimated input power values and a reference power;
   wherein, when the another decoding process performed on the first packet is still unsuccessful, the controller selects one or a plurality of sets of candidate error position information according to one of the power differences that is higher than a predetermined threshold.

3. The decoding apparatus according to claim 2, wherein the controller selects the one or the plurality of sets of candidate error position information in a way that a total amount of the set of error position information and the one or the plurality of sets of candidate error position information do not exceed a predetermined error information amount limit.

4. The decoding apparatus according to claim 2, wherein the controller requests the error correction decoder to further again perform the decoding process on the first packet according to the one or a plurality sets of candidate error position information.

5. The decoding apparatus according to claim 2, wherein after the controller selects the plurality of sets of candidate error position information according to the plurality of power differences, the controller further selects a first candidate combination from the plurality of sets of candidate error position information, and requests the error correction decoder to again perform the decoding process on the first packet according to the first candidate combination; the decoding apparatus further comprising:
- a checking circuit, determining whether the corrected first packet satisfies an error distribution condition when the decoding process performed on the first packet according to the first candidate combination is successful;
- wherein, when a determination result of the checking circuit is affirmative, the controller selects a second candidate combination from the plurality of sets of candidate error information, and requests the error correction decoder to again perform the decoding process on the first packet according to the second candidate combination.

6. A decoding method, comprising:
a) performing a differential decoding process on a plurality of sets of data to be differential decoded according to a differential encoding dependency to generate a differential decoding result;
b) performing a decoding process on a plurality of packets that need to be corrected generated according to the differential decoding results to accordingly generate respective error correction records, wherein the packets are generated according to the differential decoding result, and the packets comprise a first packet and a second packet;
c) when the error correction record of the first packet indicates that the decoding process performed on the first packet is unsuccessful, generating a set of error position information according to the error correction record of the second packet, wherein the second packet and the first packet are correlated by the differential encoding dependency; and
d) performing another decoding process on the first packet according to the set of error position information.

7. The decoding method according to claim 6, further comprising:
e1) generating a plurality of estimated input power values for the first packet;
e2) calculating respective power differences between the estimated input power values and a reference power; and
e3) when the another decoding process performed on the first packet is still unsuccessful, selecting one or a plurality of sets of candidate error position information according to one of the power differences that is higher than a predetermined threshold.

8. The decoding method according to claim 7, wherein when the one or the plurality of sets of candidate error position information are selected in step (e3), a total amount of the error position information and the one or the plurality of sets of candidate error position information do not exceed a predetermined error information amount limit.

9. The decoding method according to claim 7, further comprising:
again performing the decoding process on the first packet according to the one or a plurality of sets of candidate error position information.

10. The decoding method according to claim 7, wherein step (e3) selects a plurality of sets of candidate error position information according to the plurality of power differences; the decoding method further comprising:
selecting a first candidate combination from the plurality of sets of candidate error position information;
again performing the decoding process on the first packet according to the first candidate combination;
determining whether the corrected first packet satisfies an error distribution condition when the decoding process again performed on the first packet according to the first candidate combination is successful;
selecting a second candidate combination from the plurality of sets of candidate error position information when the corrected first packet satisfies the error distribution condition; and
again performing the decoding process on the first packet according to the second candidate combination.

* * * * *